US012268066B2

(12) United States Patent
Chen et al.

(10) Patent No.: US 12,268,066 B2
(45) Date of Patent: Apr. 1, 2025

(54) DISPLAY PANEL, METHOD OF MANUFACTURING THE SAME AND DISPLAY DEVICE

(71) Applicant: BOE Technology Group Co., Ltd., Beijing (CN)

(72) Inventors: Yipeng Chen, Beijing (CN); Lujiang Huangfu, Beijing (CN); Libin Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 447 days.

(21) Appl. No.: 17/762,697

(22) PCT Filed: Apr. 15, 2021

(86) PCT No.: PCT/CN2021/087371
§ 371 (c)(1),
(2) Date: Mar. 22, 2022

(87) PCT Pub. No.: WO2021/227761
PCT Pub. Date: Nov. 18, 2021

(65) Prior Publication Data
US 2022/0406874 A1 Dec. 22, 2022

(30) Foreign Application Priority Data

May 9, 2020 (CN) .......................... 202010387399.9

(51) Int. Cl.
*H01L 27/32* (2006.01)
*H10K 59/121* (2023.01)
(Continued)

(52) U.S. Cl.
CPC ....... *H10K 59/131* (2023.02); *H10K 59/1216* (2023.02); *H10K 71/00* (2023.02); *H10K 59/1201* (2023.02)

(58) Field of Classification Search
CPC .. H10K 59/131; H10K 59/1216; H10K 71/00; H10K 59/1201; H10K 71/621;
(Continued)

(56) References Cited

U.S. PATENT DOCUMENTS

2009/0009070 A1 1/2009 Chan et al.
2016/0217746 A1* 7/2016 An .................. G09G 3/3233
(Continued)

FOREIGN PATENT DOCUMENTS

CN 106448555 A 2/2017
CN 108227263 A 6/2018
(Continued)

OTHER PUBLICATIONS

CN 202010387399.9 first office action.
PCT/CN2021/087371 international search report and written opinion.

*Primary Examiner* — Mohammed R Alam
(74) *Attorney, Agent, or Firm* — IPro, PLLC

(57) ABSTRACT

The present disclosure provides a display panel, a manufacturing method thereof, and a display device. The initialization signal line layer in the display panel includes an initialization signal line pattern arranged in each sub-pixel area; the anode layer includes a plurality of anode patterns, and an anode spacing area is formed between adjacent anode patterns; the first auxiliary signal line layer is a grid structure, at least part of the first auxiliary signal line layer is located in the anode spacing area, and the initialization signal line pattern in each sub-pixel area is coupled to the first auxiliary signal line layer.

14 Claims, 10 Drawing Sheets

(51) Int. Cl.
*H10K 59/131* (2023.01)
*H10K 71/00* (2023.01)
*H10K 59/12* (2023.01)

(58) Field of Classification Search
CPC ......... H10K 59/353; G09G 2300/0426; G09G 2300/0819; G09G 2300/0842; G09G 2300/0861; G09G 2310/0251; G09G 2310/061; G09G 2320/0209; G09G 3/3258; G09G 3/3225; H01L 27/124; H01L 27/1259
See application file for complete search history.

(56) References Cited

U.S. PATENT DOCUMENTS

| | | | |
|---|---|---|---|
| 2016/0329391 A1* | 11/2016 | Ko | ........................ H10K 59/121 |
| 2017/0221418 A1 | 8/2017 | Xiang et al. | |
| 2020/0227500 A1 | 7/2020 | Chen et al. | |

FOREIGN PATENT DOCUMENTS

| | | |
|---|---|---|
| CN | 109166886 A | 1/2019 |
| CN | 109461407 A | 3/2019 |
| CN | 109742092 A | 5/2019 |
| CN | 110085651 A | 8/2019 |
| CN | 110867525 A | 3/2020 |
| CN | 210349260 U | 4/2020 |
| CN | 111508978 A | 8/2020 |

\* cited by examiner

DISPLAY PANEL, METHOD OF MANUFACTURING THE SAME AND DISPLAY DEVICE

CROSS-REFERENCE TO RELATED APPLICATION

This application is the U.S. national phase of PCT Application No. PCT/CN2021/087371 filed on Apr. 15, 2021, which claims priorities of the Chinese patent application No. 202010387399.9 filed on May 9, 2020, which is incorporated herein by reference in its entity

TECHNICAL FIELD

The present disclosure relates to the field of display technology, and more particularly to a display panel, a method of manufacturing the same and a display device.

BACKGROUND

Active-matrix organic light emitting diode (AMOLED) display panels are widely used in various fields due to their advantages of self-luminescence, low power consumption, and fast response speed. The AMOLED display panel includes a sub-pixel driving circuit and a light emitting unit, and the corresponding light emitting unit is driven to emit light by the sub-pixel driving circuit, so as to realize the display function of the display panel.

However, as the resolution of the display panel becomes higher and higher, the layout space in the display panel becomes smaller and smaller. When the initialization signal line pattern used to provide an initialization signal for the sub-pixel driving circuit is laid out, the initialization signal line patterns in the same row are not easily connected together, resulting in increased production cost of the display panel.

SUMMARY

The objective of the disclosed solution is to provide a display panel, a method of driving the same, and a display device.

In order to achieve the above object, the present disclosure provides the following technical solutions.

A first aspect of the present disclosure provides a display panel, including: a substrate, and an initialization signal line layer and an anode layer sequentially stacked on the substrate along a direction away from the substrate, and a plurality of sub-pixel areas arranged in an array; wherein the initialization signal line layer includes an initialization signal line pattern arranged in each of the plurality of sub-pixel areas; the anode layer includes a plurality of anode patterns corresponding to the plurality of sub-pixel areas in a one-to-one manner, the plurality of anode patterns are arranged at intervals, and an anode spacing area is formed between adjacent anode patterns; the display panel further includes: a first auxiliary signal line layer, the first auxiliary signal line layer has a grid structure, and at least part of the first auxiliary signal line layer is located in the anode spacing area and is insulated from the anode pattern, and the initialization signal line pattern in each of plurality of the sub-pixel areas is coupled to the first auxiliary signal line layer.

Optionally, the display panel further includes: a conductive connection portion layer located between the initialization signal line layer and the first auxiliary signal line layer, wherein the conductive connection portion layer includes a first conductive connection portion arranged in each of plurality of the sub-pixel areas; in a same sub-pixel area, a first overlapping area is formed between orthographic projection of the first conductive connection portion on the substrate and orthographic projection of the initialization signal line pattern on the substrate, a second overlapping area is formed between the orthographic projection of the first conductive connection portion on the substrate and the first auxiliary signal line layer, the first conductive connection portion is coupled to the initialization signal line pattern in the first overlapping area, and the first conductive connection portion is coupled to the first auxiliary signal line layer in the second overlapping area.

Optionally, each of the initialization signal line patterns includes a first sub-pattern and a second sub-pattern, and in adjacent sub-pixel areas in a same row along a first direction, a second sub-pattern in a previous sub-pixel area and a first sub-pattern in a current sub-pixel area form an integral structure; the second sub-pattern is coupled to the first auxiliary signal line layer in each of the plurality of sub-pixel areas.

Optionally, the display panel further includes: a power supply signal line layer located between the initialization signal line layer and the anode layer, wherein the power supply signal line layer includes a power supply signal line pattern arranged in each of the plurality of sub-pixel areas, and at least part of the power supply signal line pattern extends along a second direction; and a second auxiliary signal line layer located between the initialization signal line layer and the power supply signal line layer, wherein the second auxiliary signal line layer includes second auxiliary signal line patterns corresponding to the plurality of sub-pixel areas in a one-to-one manner, a third overlapping area is formed between orthographic projection of the power signal line pattern on the substrate and orthographic projection of a corresponding second auxiliary signal line pattern on the substrate, the second auxiliary signal line pattern is coupled to the power supply signal line pattern in the third overlapping area, orthographic projection of the second auxiliary signal line pattern on the substrate overlaps orthographic projection of the corresponding initialization signal line pattern on the substrate.

Optionally, the second auxiliary signal line pattern includes a first portion extending along the first direction and a second portion extending along the second direction, the first direction intersects the second direction; the initialization signal line pattern includes a third portion extending along the first direction and a fourth portion extending along the second direction, and orthographic projection of the first portion on the substrate overlaps orthographic projection of the third portion on the substrate, and orthographic projection of the second portion on the substrate overlaps orthographic projection of the fourth portion on the substrate.

Optionally, the initialization signal line pattern includes a first sub-pattern and a second sub-pattern, and the first sub-pattern includes the third portion, the second sub-pattern includes the third portion and the fourth portion; in adjacent sub-pixel areas in a same row along the first direction, orthographic projection of the first portion of the second auxiliary signal line pattern corresponding to a previous sub-pixel area on the substrate overlaps orthographic projection of the third portion of the second sub-pattern in the previous sub-pixel area on the substrate, and overlaps orthographic projections of the third portion of the first sub-pattern in a current sub-pixel on the substrate.

Optionally, the third overlapping area is formed between the orthographic projection of the second portion on the substrate and the orthographic projection of the power signal line pattern on the substrate, the second portion is coupled to the power signal line pattern through a third via hole arranged in the third overlapping area, and orthographic projection of the third via hole on the substrate does not overlap the orthographic projection of the initialization signal line pattern on the substrate.

Optionally, the display panel further includes: a third auxiliary signal line layer located between the initialization signal line layer and the power supply signal line layer, wherein the third auxiliary signal line layer includes a third auxiliary signal line pattern located in each of the plurality of sub-pixel areas, and at least part of the third auxiliary signal line pattern extends along the first direction; in a same sub-pixel area, a fourth overlapping area is formed between orthographic projection of the third auxiliary signal line pattern on the substrate and the orthographic projection of the power signal line pattern on the substrate, and the third auxiliary signal line pattern is coupled to the power signal line patterns in the fourth overlapping area; third auxiliary signal line patterns in a same row of sub-pixel areas along the first direction are coupled in sequence Optionally, the display panel further includes: a transistor structure and a storage capacitor, wherein the storage capacitor includes a first electrode plate and a second electrode plate arranged opposite to each other, the first electrode plate is located between the substrate and the second electrode plate, and the first electrode plate and a gate electrode of the transistor structure are arranged at a same layer and made of a same material; the second auxiliary signal line layer and the third auxiliary signal line layer are arranged at a same layer and made of a same material as the second electrode plate.

Optionally, the display panel further includes: a gate line pattern and a reset signal line pattern located in each of the plurality of sub-pixel areas, wherein a gate line pattern in a current sub-pixel area and a reset signal line pattern in a next sub-pixel area adjacent in the second direction form an integral structure.

Optionally, the display panel further includes a transistor structure, wherein the initialization signal line pattern and an active layer in the transistor structure are arranged at a same layer and made of a same material.

Optionally, the first auxiliary signal line layer and the anode layer are arranged at a same layer and made of a same material.

Optionally, the display panel further includes: a power signal line pattern, a data line pattern, a reset signal line pattern, a light emitting control signal line pattern and a gate line pattern located in each of the plurality of sub-pixel areas; and sub-pixel driving circuits corresponding to the plurality of sub-pixel areas in a one-to-one manner, wherein each of the sub-pixel driving circuits includes: a first transistor, a second transistor, a third transistor, a fourth transistor, a fifth transistor, a sixth transistor, a seventh transistor, an eighth transistor and a storage capacitor; a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor; a gate electrode of the second transistor is coupled to the gate line pattern, a first electrode of the second transistor is coupled to a second electrode of the third transistor, a second electrode of the second transistor is coupled to the gate electrode of the third transistor; a first electrode of the third transistor is coupled to the power signal line pattern; a gate electrode of the fourth transistor is coupled to the reset signal line pattern, a first electrode of the fourth transistor is coupled to the initialization signal line pattern, and a second electrode of the fourth transistor is coupled to the gate electrode of the third transistor; a gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor; a gate electrode of the sixth transistor is coupled to the light emitting control signal line pattern, a first electrode of the sixth transistor is coupled to the initialization signal line pattern, and a second electrode of the sixth transistor is coupled to the second electrode plate of the storage capacitor; a gate electrode of the seventh transistor is coupled to the light emitting control signal line pattern, a first electrode of the seventh transistor is coupled to the second electrode of the third transistor, and a second electrode of the seventh transistor is coupled to a corresponding anode pattern; a gate electrode of the eighth transistor is coupled to the reset signal line pattern, a first electrode of the eighth transistor is coupled to the initialization signal line pattern, and a second electrode of the eighth transistor is coupled to the corresponding anode pattern.

Optionally, the sub-pixel driving circuit further comprises a ninth transistor, a gate electrode of the ninth transistor is coupled to the light emitting control signal line pattern, a first electrode of the ninth transistor is coupled to the gate electrode of the third transistor, and a second electrode of the ninth transistor is floating.

Based on the technical solution of the display panel, a second aspect of the present disclosure provides a display device including the display panel.

Based on the technical solution of the display panel, a third aspect of the present disclosure provides a method of manufacturing a display panel comprising a plurality of sub-pixel areas arranged in an array; including: forming an initialization signal line layer on a substrate, the initialization signal line layer including an initialization signal line pattern arranged in each of the plurality of sub-pixel areas; forming a first auxiliary signal line layer and an anode layer on a side of the initialization signal line pattern away from the substrate; wherein the anode layer includes a plurality of anode patterns corresponding to the plurality of sub-pixel areas in a one-to-one manner, the plurality of anode patterns are arranged at intervals, and an anode spacing area is formed between adjacent anode patterns; the first auxiliary signal line layer is a grid structure, and at least part of the first auxiliary signal line layer is located in the anode spacing area and insulated from the anode pattern, and the initialization signal line pattern in each of the plurality of sub-pixel areas is coupled to the first auxiliary signal line layer.

BRIEF DESCRIPTION OF THE DRAWINGS

The drawings described here are used to provide a further understanding of the present disclosure and constitute a portion of the present disclosure. The exemplary embodiments and descriptions of the present disclosure are used to explain the present disclosure, and do not constitute an improper limitation of the present disclosure.

DETAILED DESCRIPTION

In order to further illustrate the display panel, the method of manufacturing the same, and the display device provided by the embodiments of the present disclosure, a detailed description is given below with reference to the accompanying drawings.

Referring to FIGS. 1 to 5, an embodiment of the present disclosure provides a display panel, including: a substrate, and an initialization signal line layer and an anode layer sequentially stacked on the substrate along a direction away from the substrate; further including a plurality of sub-pixel areas arranged in an array.

Figure 3:
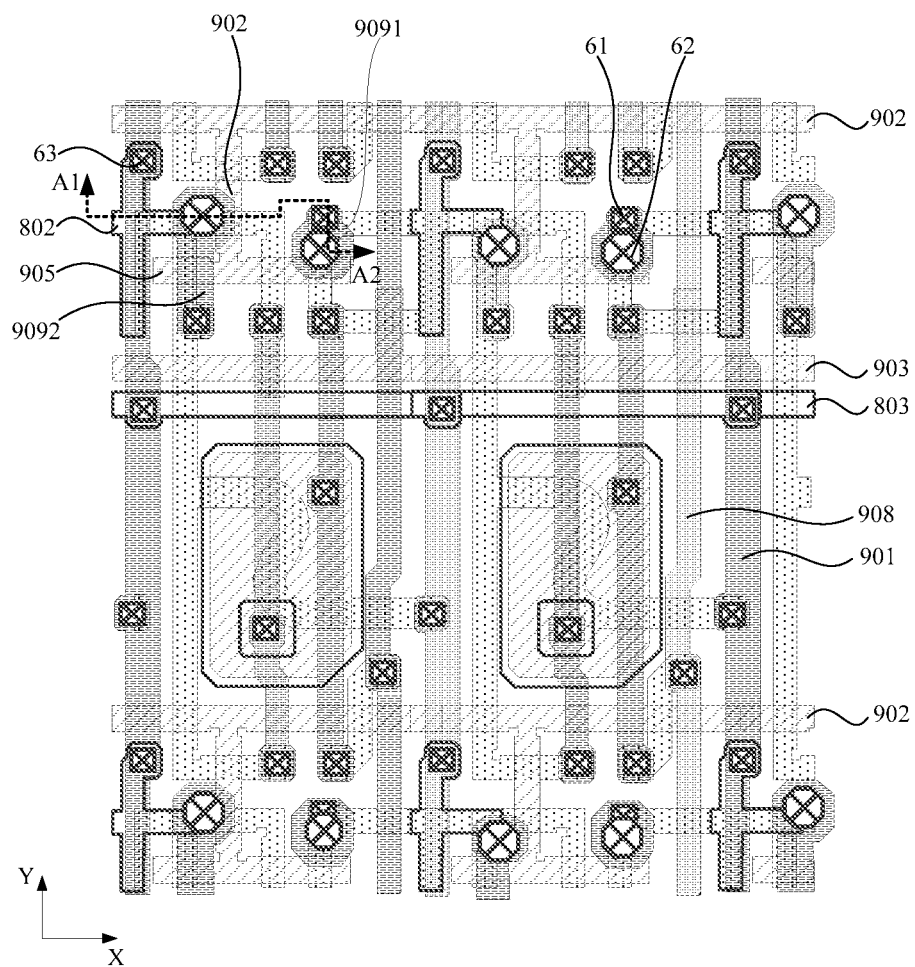
FIG. 3 is a schematic diagram of a layout of a sub-pixel driving circuit provided by an embodiment of the present disclosure.
Figure 4:
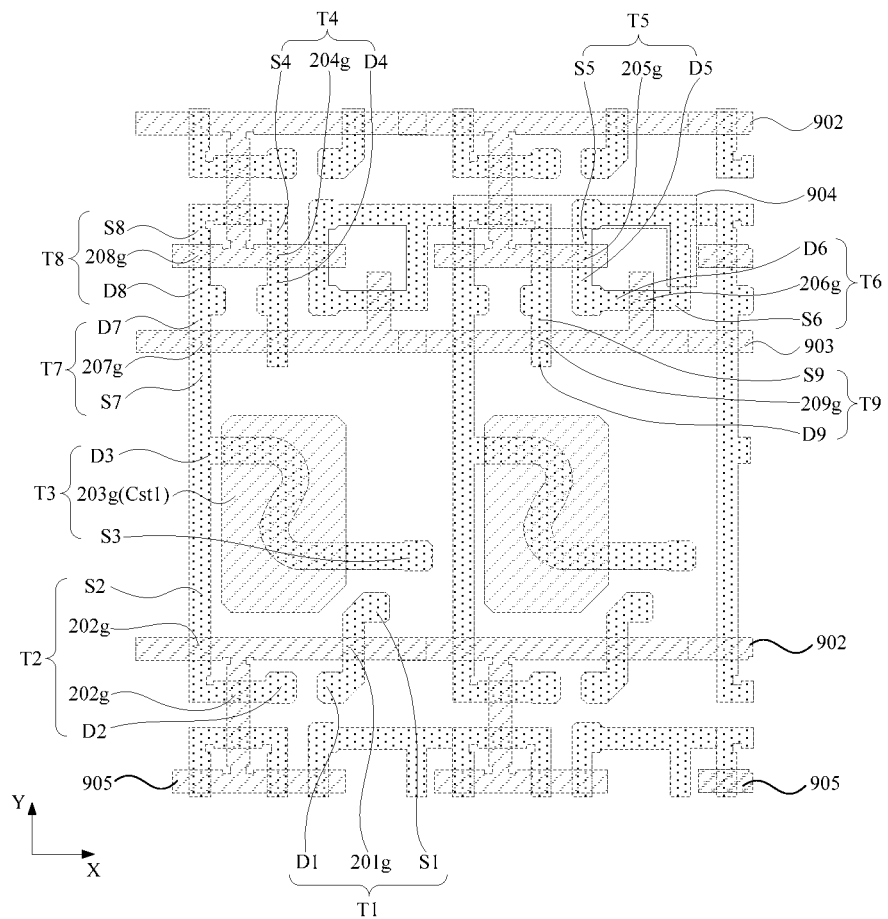
FIG. 4 is a schematic diagram of a layout of the active film layer and the first gate metal layer in FIG. 3.
Figure 5:
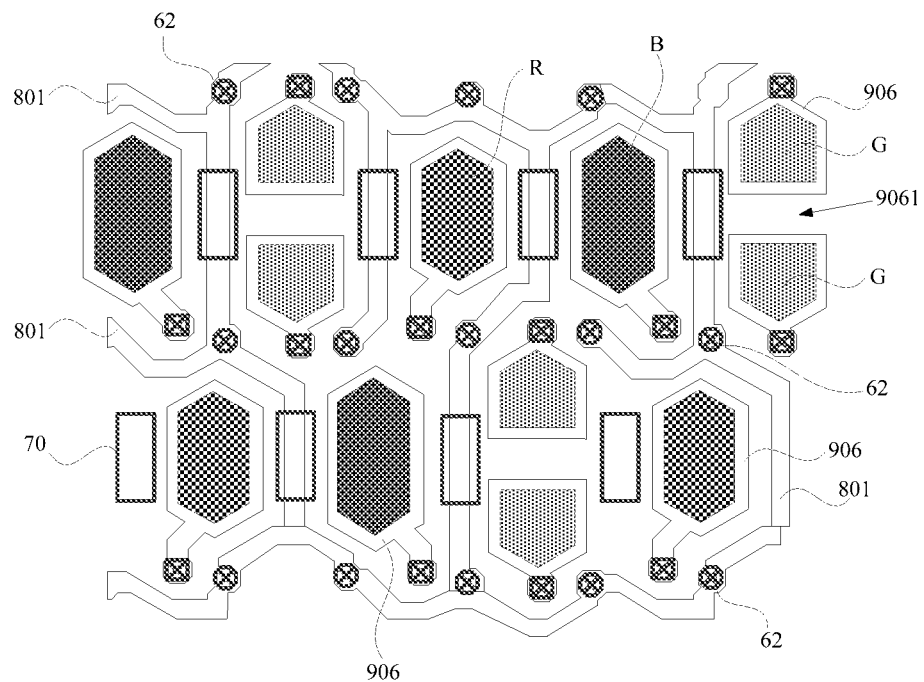
FIG. 5 is a schematic diagram of a layout of a first auxiliary signal line layer provided by an embodiment of the present disclosure.
Figure 7:
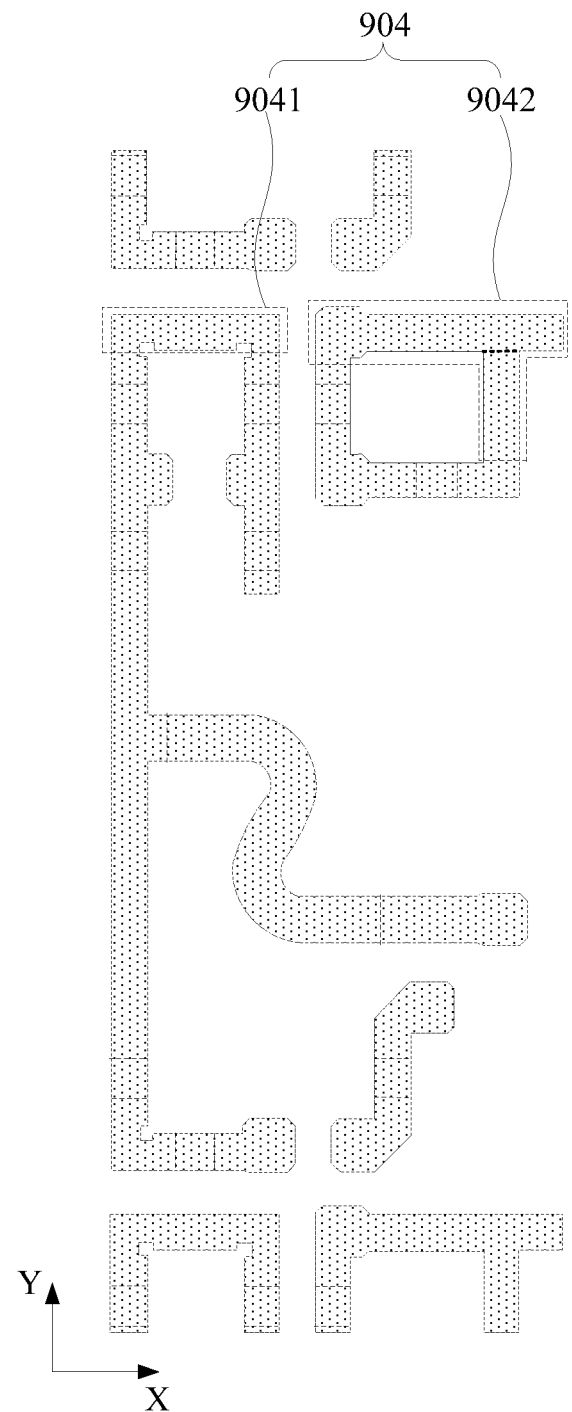
FIG. 7 is a schematic diagram of a layout of an active film layer in one sub-pixel area in FIG. 3.

As shown in FIG. 3, FIG. 4 and FIG. 7, the initialization signal line layer includes an initialization signal line pattern 904 arranged in each of the sub-pixel areas;

As shown in FIG. 5, the anode layer includes a plurality of anode patterns 906 corresponding to the plurality of sub-pixel areas in a one-to-one manner, the plurality of anode patterns 906 are arranged at intervals, and an anode spacing area 9061 is formed between adjacent anode patterns 906;

As shown in FIG. 5, the display panel further includes: a first auxiliary signal line layer 801, the first auxiliary signal line layer 801 has a grid structure, and at least part of the first auxiliary signal line layer 801 is located in the anode spacing area 9061 and is insulated from the anode pattern 906, and the initialization signal line pattern 904 in each of the sub-pixel areas is coupled to the first auxiliary signal line layer 801.

Specifically, the plurality of sub-pixel areas arranged in the array can be divided into multiple rows of sub-pixel areas sequentially arranged along the second direction, and multiple columns of sub-pixel areas sequentially arranged along the first direction. Each row of sub-pixel areas includes a plurality of sub-pixel areas at intervals along the first direction, and each column of sub-pixel areas includes a plurality of sub-pixel areas at intervals along the second direction. The first direction intersects the second direction. Exemplarily, the first direction includes the X direction, and the second direction includes the Y direction.

The initialization signal line layer includes a plurality of initialization signal line patterns 904, the plurality of initialization signal line patterns 904 correspond to the plurality of sub-pixel areas in a one-to-one manner, and the initialization signal line pattern 904 is located in the corresponding sub-pixel area, used to provide an initialization signal for the sub-pixel driving circuit corresponding to the sub-pixel area.

The anode layer is located on the side of the sub-pixel driving circuit in the display panel away from the substrate, and the anode layer includes a plurality of anode patterns 906, and the plurality of anode patterns 906 are spaced apart from each other. An anode spacing area 9061 is formed between adjacent anode patterns. The anode patterns 906 correspond to the sub-pixel driving circuits in the display panel in a one-to-one manner. The anode pattern 906 is coupled to the corresponding sub-pixel driving circuit and can receive a driving signal provided by the corresponding sub-pixel driving circuit. A light emitting functional layer and a cathode layer are arranged at the side of the anode layer away from the substrate, the light emitting functional layer is located between the anode layer and the cathode layer, and can emit light of the corresponding color under the action of the electric field formed between the anode layer and the cathode layer. It should be noted that the light emitting functional layer may specifically include a hole injection layer, a hole transport layer, an organic light emitting material layer, an electron transport layer and an electron injection layer stacked to each other, but is not limited thereto. As shown in FIG. 5, a red light emitting element R, a green light emitting element G, and a blue light emitting element B are shown, and light emitting elements of different colors correspond to organic light emitting material layers of different colors.

As shown in FIG. 5, the display panel further includes a first auxiliary signal line layer 801, and at least part of the first auxiliary signal line layer 801 is arranged in the anode spacing area 9061 and insulated from the anode pattern 906. The anode spacing area 9061 is formed as a grid area, so that the first auxiliary signal line layer 801 arranged in the anode spacing area 9061 is formed into a grid structure. Exemplarily, the first auxiliary signal line layer 801 may be arranged in all the anode spacing areas 9061 in the display panel.

Figure 6:
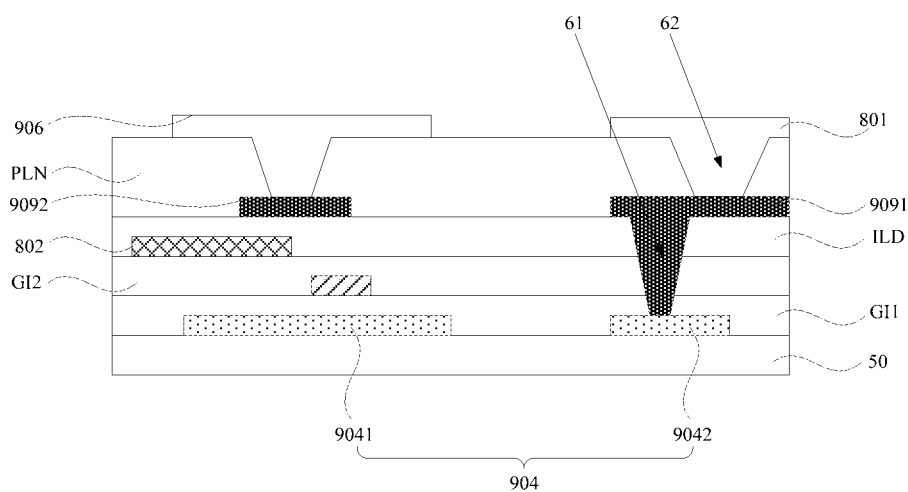
FIG. 6 is a schematic cross-sectional view along the A1-A2 direction in FIG. 3.

It is worth noting that, as shown in FIG. 6, the display panel further includes a planarization layer PLN, and the anode layer (including the anode pattern 906) is generally formed on the surface of the planarization layer PLN away from the substrate 50. The first auxiliary signal line layer 801 is arranged in the anode spacing area 9061, so that the first auxiliary signal line layer 801 is also arranged on the surface of the planarization layer PLN away from the substrate 50. In such layout method, an auxiliary signal line layer 801 is arranged at the same layer as the anode layer to avoid increasing the thickness of the display panel due to the introduction of the first auxiliary signal line layer 801.

The first auxiliary signal line layer 801 is arranged in the anode spacing area 9061, so that the first auxiliary signal line layer 801 is located on the side of the initialization signal line pattern 904 away from the substrate 50. Illustratively, a via hole can be provided between the first auxiliary signal line layer 801 and the initialization signal line pattern 904, so that the first auxiliary signal line layer 801 is coupled to the initialization signal line pattern 904 through the via hole.

According to the specific structure of the above-mentioned display panel, the display panel provided by the embodiment of the present disclosure includes an initialization signal line pattern 904 located in each sub-pixel area, and a first auxiliary signal line layer 801 of a grid structure located in the anode spacing area 9061. The initialization signal line pattern 904 in each of the sub-pixel areas is coupled to the first auxiliary signal line layer 801, so that the first auxiliary signal line layer 801 couples all the initialization signal line patterns 904 together, so that the first auxiliary signal line layer 801 can provide the initialization signal for the initialization signal line pattern 904 in each sub-pixel area; therefore, in the display panel provided by the embodiments of the present disclosure, the initialization signal line pattern 904 in each sub-pixel area is coupled to the first auxiliary signal line layer 801 arranged in the anode spacing area 9061, which solves the problem that the initialization signal line patterns 904 in the same row are not easily connected together due to the limited layout space of the display panel.

Moreover, in the display panel provided by the embodiment of the present disclosure, the first auxiliary signal line layer 801 may be arranged in all the anode spacing areas 9061 in the display area, and the initialization signal line pattern 904 in each sub-pixel area is coupled to the first auxiliary signal line layer 801, thereby ensuring the stability of the initialization signal transmitted on the initialization signal line pattern 904 in each sub-pixel area. In addition, the first auxiliary cathode layer is arranged in the anode spacing area 9061, so that the first auxiliary signal line layer 801 and the anode layer can be arranged in the same layer, which is more conductive to the thinning of the display panel.

It should be noted that the initialization signal line pattern 904 provided in the above-mentioned embodiment is not only used to provide the initialization signal (Vinit) for the corresponding sub-pixel driving circuit, but also can be used to provide the reference signal (Vref) for the corresponding sub-pixel driving circuit.

As shown in FIG. 3, FIG. 5 and FIG. 6, in some embodiments, the display panel further includes:

a conductive connection portion layer located between the initialization signal line layer and the first auxiliary signal line layer 801, the conductive connection portion layer includes a first conductive connection portion 9091 arranged in each of the sub-pixel areas; in the same sub-pixel area, a first overlapping area is formed between orthographic projection of the first conductive connection portion 9091 on the substrate 50 and orthographic projection of the initialization signal line pattern 904 (the first sub-pattern 9041 in FIG. 6) on the substrate 50. A second overlapping area is formed between the orthographic projection of the first conductive connection portion 9091 on the substrate 50 and the first auxiliary signal line layer 801, the first conductive connection portion 9091 is coupled to the initialization signal line pattern 904 in the first overlapping area, and the first conductive connection portion 9091 is coupled to the first auxiliary signal line layer 801 in the second overlapping area.

Specifically, the conductive connection portion layer can be made of the first source-drain metal layer in the display panel, and the specific structure of the first conductive connection portion 9091 included in the conductive connection portion layer can be set according to actual needs, as long as the first overlapping area is formed between that the orthographic projection of the first conductive connection portion 9091 on the substrate 50 and the orthographic projection of the initialization signal line pattern 904 on the substrate 50, and the second overlapping area is formed between the orthographic projection of the first conductive connection portion 9091 on the substrate 50 and the first auxiliary signal line layer 801.

As shown in FIG. 3 and FIG. 6, exemplarily, the first conductive connection portion 9091 is coupled to the initialization signal line pattern 904 through the first via hole 61 located in the first overlapping area, and the first conductive connecting portion 9091 is coupled to the first auxiliary signal line layer 801 through the second via hole 62 located in the second overlapping area. It should be noted that, FIG. 6 shows the second conductive connection portion 9092, the first gate insulating layer GI1, the second gate insulating layer GI2, the interlayer insulating layer ILD and the planarization layer PLN.

In the display panel provided by the above-mentioned embodiment, the coupling between the initialization signal line pattern 904 and the first auxiliary signal line layer 801 is realized by arranging the first conductive connection portion 9091, thereby avoiding forming a deep via hole between the initialization signal line pattern 904 and the first auxiliary signal line layer 801, which greatly improves the reliable coupling between the initialization signal line pattern 904 and the first auxiliary signal line layer 801. Moreover, this arrangement allows more layout methods for the initialization signal line pattern 904 and the first auxiliary signal line layer 801, which reduces the layout difficulty and manufacturing process difficulty of the display panel.

Figure 8:
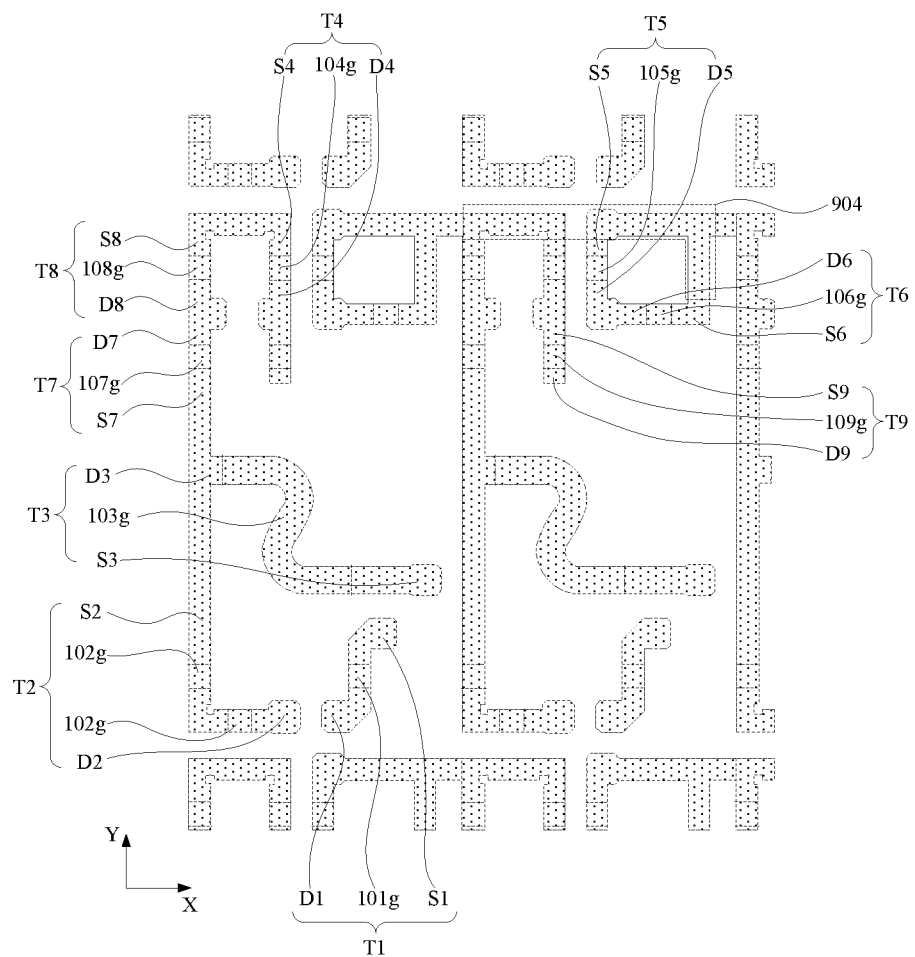
FIG. 8 is a schematic diagram of the layout of the active film layer in FIG. 3.

As shown in FIG. 6, FIG. 7 and FIG. 8, in some embodiments, each of the initialization signal line patterns 904 includes a first sub-pattern 9041 and a second sub-pattern 9042, and in the adjacent sub-pixel areas in the same row along the first direction, the second sub-pattern 9042 in the previous sub-pixel area and the first sub-pattern 9041 in the current sub-pixel area form an integral structure; in each sub-pixel area, the second sub-pattern 9042 is coupled to the first auxiliary signal line layer 801.

Specifically, the specific structures of the initialization signal line patterns 904 are various. Exemplarily, each of the initialization signal line patterns 904 includes a first sub-pattern 9041 and a second sub-pattern 9042, in the same sub-pixel area, the first sub-pattern 9041 and the second sub-pattern 9042 are arranged along the first direction. When the initialization signal line pattern 904 has such structure, in adjacent sub-pixel areas, the second sub-pattern 9042 in the previous sub-pixel area and the first sub-pattern in the current sub-pixel area 9041 are adjacent to each other.

In the above arrangement, in the adjacent sub-pixel areas in the same row along the first direction, the second sub-pattern 9042 in the previous sub-pixel area and the first sub-pattern 9041 in the current sub-pixel area form an integral structure, which is not only conducive to improving the stability of the initialization signal transmitted on the initialization signal line pattern 904, but also effectively reduce the manufacturing difficulty of the initialization signal line pattern 904.

It should be noted that when the initialization signal line pattern 904 includes the first sub-pattern 9041 and the second sub-pattern 9042, exemplarily, the first sub-pattern 9041 and the second sub-pattern 9042 are respectively coupled to the first auxiliary signal line layer 801, which ensures the connection performance between the initialization signal line pattern 904 and the first auxiliary signal line layer 801, and can more effectively improve the stability of the initialization signal transmitted by the initialization signal line pattern 904; or, as shown in FIG. 6, the second sub-pattern 9042 is coupled to the first auxiliary signal line layer 801 in each sub-pixel area, that is, as shown in FIG. 6, the first conductive connection portion 9091 is coupled to the second sub-pattern 9042 through the first via hole 61 located in the first overlapping area, and the first conductive connection portion 9091 is coupled to the first auxiliary signal line layer 801 through the second via hole 62 in the second overlapping area.

Figure 9:
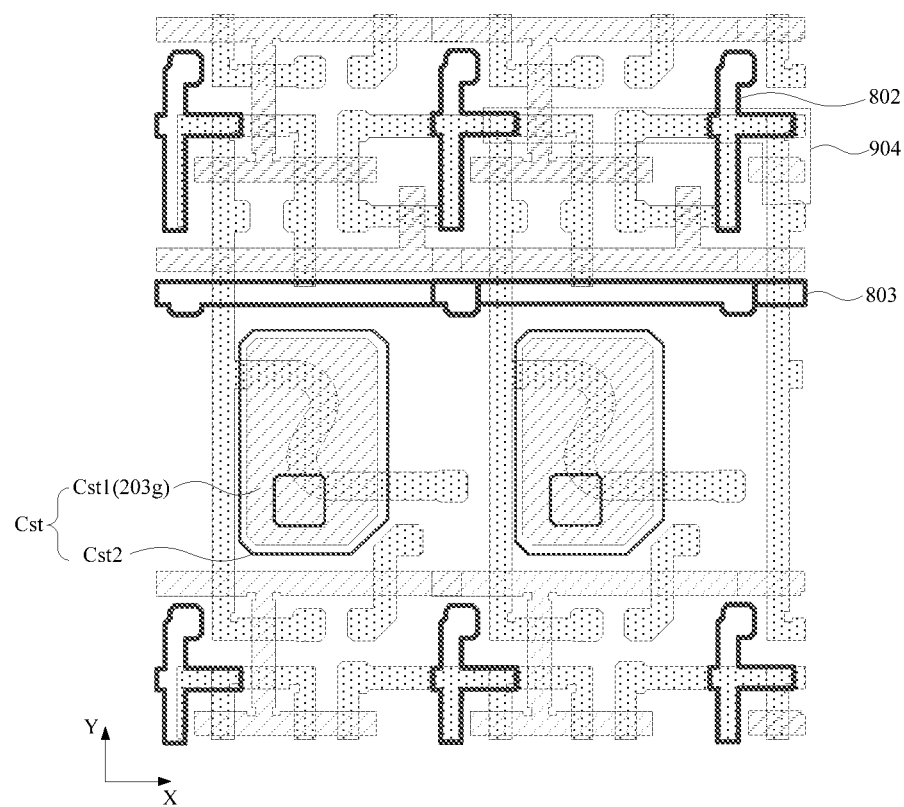
FIG. 9 is a schematic diagram of the layout of the active film layer, the first gate metal layer and the second gate metal layer in FIG. 3.
Figure 12:
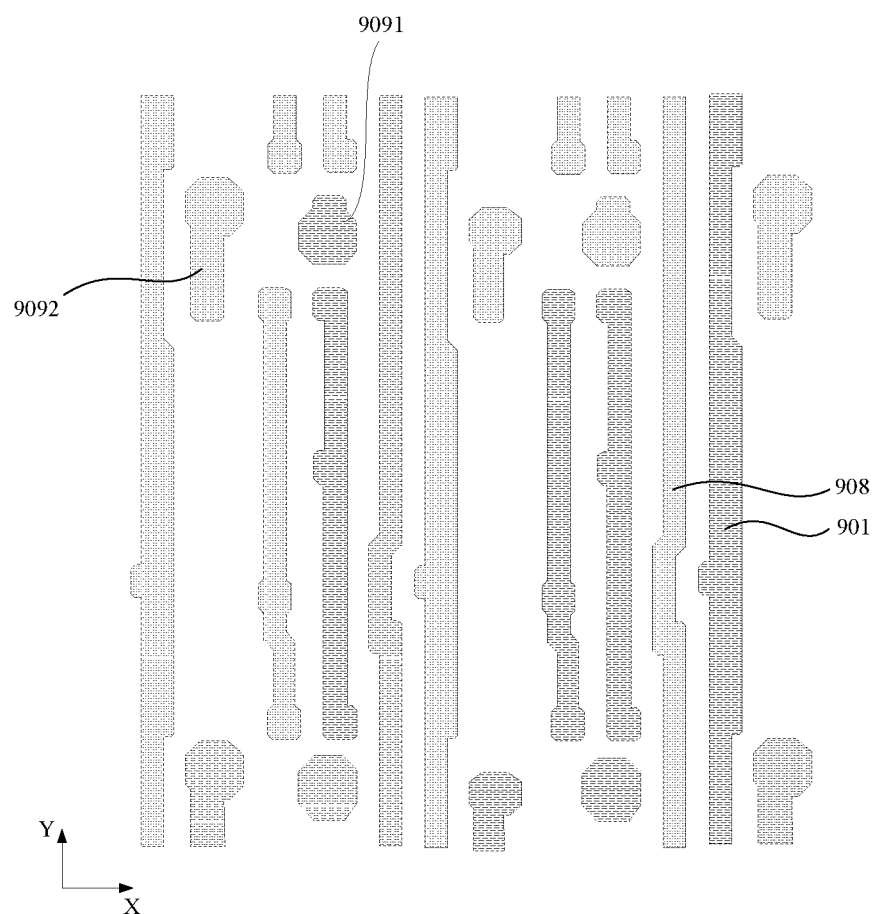
FIG. 12 is a schematic diagram of a layout of a first source-drain metal layer in FIG. 3.

As shown in FIG. 3, FIG. 9 and FIG. 12, in some embodiments, the display panel further includes:

A power supply signal line layer located between the initialization signal line layer and the anode layer, the power supply signal line layer includes a power supply signal line pattern 901 arranged in each of the sub-pixel areas, and at least part of the power supply signal line pattern 901 extends along the second direction;

A second auxiliary signal line layer located between the initialization signal line layer and the power supply signal line layer, the second auxiliary signal line layer includes second auxiliary signal line patterns 802 corresponding to the sub-pixel areas in a one-to-one manner, a third overlapping area is formed between the orthographic projection of the power signal line pattern 901 on the substrate and the orthographic projection of the corresponding second auxiliary signal line pattern 802 on the substrate, the second auxiliary signal line pattern 802 is coupled to the power supply signal line pattern 901 in the third overlapping area, the orthographic projection of the second auxiliary signal line pattern 802 on the substrate overlaps the orthographic projection of the corresponding initialization signal line pattern 904 on the substrate.

Specifically, the power supply signal line layer includes a power supply signal line patterns 901 arranged in each of the sub-pixel areas, the power supply signal line patterns 901 correspond to the sub-pixel areas in a one-to-one manner, and the power supply signal line pattern 901 is located in the corresponding sub-pixel area. At least a portion of the power signal line pattern 901 extends along the second direction, and the power signal line patterns 901 in each column of sub-pixel areas are sequentially coupled along the second direction, and can form an integral structure.

It is worth noting that the light emitting current of the light emitting element in the display panel is $I_{oled} = k[(Vdata - Vinit)]^2$, where k is a constant, Vdata is the voltage value of the data signal transmitted by the data line pattern 908 in the display panel, and Vinit is the voltage value of the initialization signal, it can be seen that Vinit is related to the light emitting brightness of the light emitting elements in the display panel. A small change in Vinit within a frame time will cause a change in the brightness of the display screen, resulting in abnormal brightness of the display screen. Therefore, the stability of the Vinit signal is very important. However, due to the layout area, unlike the power signal line, the initialization signal line layer cannot be densely wired with low square resistance metal, so that its own signal has strong stability.

The display panel further includes a second auxiliary signal line layer. Exemplarily, the second auxiliary signal line layer is located between the initialization signal line layer and the power supply signal line layer. The second auxiliary signal line layer includes second auxiliary signal line patterns 802 corresponding to the sub-pixel areas in a one-to-one manner. The third overlapping area is formed between the orthographic projection of the second auxiliary signal line pattern 802 on the substrate and the orthographic projection of the power signal line pattern 901 in the corresponding sub-pixel area on the substrate, and the second auxiliary signal line pattern 802 is coupled to the power signal line pattern 901 in the corresponding sub-pixel area through the third via hole 63 in the third overlapping area.

Since the power signal transmitted on the power signal line pattern 901 has a stable potential, the second auxiliary signal line pattern 802 has a stable potential.

In the display panel provided by the above-mentioned embodiment, the second auxiliary signal line pattern 802 is coupled to the corresponding power supply signal line pattern 901, so that the second auxiliary signal line pattern 802 has a stable potential. At the same time, the orthographic projection of the second auxiliary signal line pattern 802 on the substrate overlaps the orthographic projection of the corresponding initialization signal line pattern 904 on the substrate, so that a capacitance structure is formed between the second auxiliary signal line pattern 802 and the corresponding initialization signal line pattern 904, thereby increasing the resistance-capacitance (RC) load of the initialization signal line pattern 904, which enhances the stability of the initialization signal transmitted on the initialization signal line pattern 904. Therefore, in the display panel provided by the above-mentioned embodiments, when the jump of other signals in the display panel occurs, the degree of fluctuation of the initialization signal can be effectively reduced, which ensures the display stability of the display panel.

Figure 11:
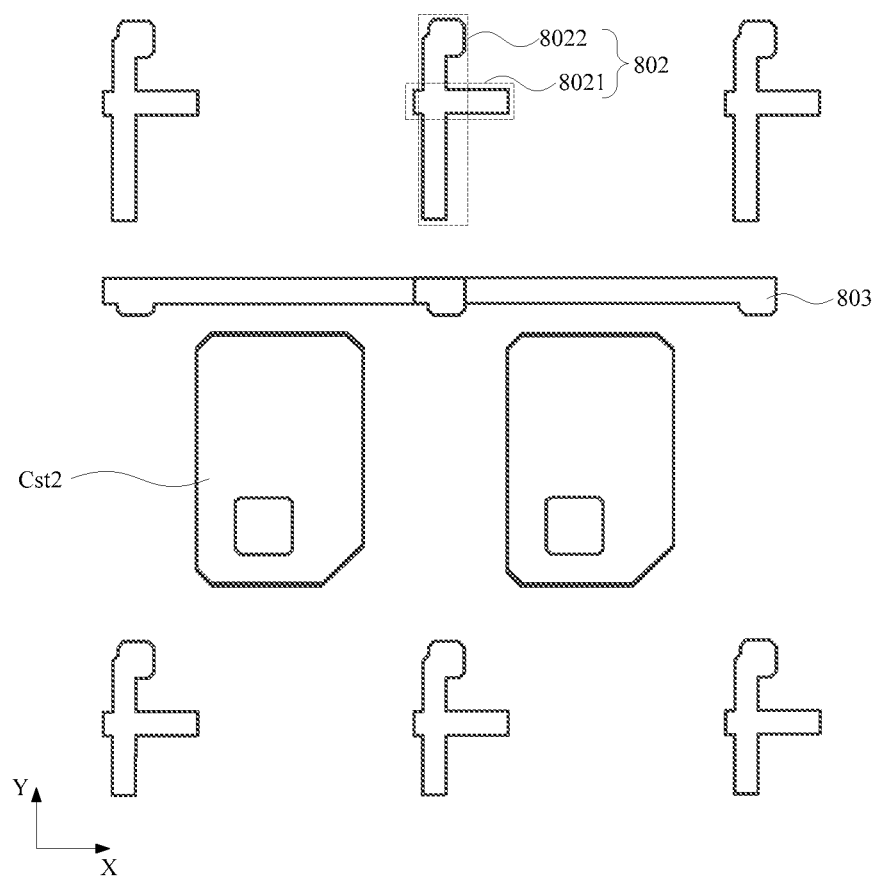
FIG. 11 is a schematic diagram of a layout of a second gate metal layer in FIG. 3.

As shown in FIG. 7 and FIG. 11, in some embodiments, the second auxiliary signal line pattern 802 includes a first portion 8021 extending in a first direction and a second portion 8022 extending in a second direction, the first direction intersects the second direction;

The initialization signal line pattern 904 includes a third portion extending along the first direction and a fourth portion extending along the second direction, and the orthographic projection of the first portion 8021 on the substrate overlaps the orthographic projection of the third portion on the substrate, and the orthographic projection of the second portion 8022 on the substrate overlaps the orthographic projection of the corresponding fourth portion on the substrate.

Specifically, the specific structure of the second auxiliary signal line pattern 802 is various. Exemplarily, the second auxiliary signal line pattern 802 includes a first portion 8021 extending along the first direction and a second portion 8022 extending along the second direction. The first portion 8021 and the second portion 8022 may be specifically formed in a cross-shaped structure or a T-shaped structure. Similarly, the specific structure of the initialization signal line pattern 904 is also various. Exemplarily, the initialization signal line pattern 904 includes a third portion extending along the first direction and a fourth portion extending along the second direction. The third portion and the fourth portion may be specifically formed in a cross-shaped structure or a T-shaped structure.

Exemplarily, the first direction includes the X direction, and the second direction includes the Y direction.

The orthographic projection of the first portion on the substrate overlaps the orthographic projection of the corresponding third portion on the substrate, and the orthographic projection of the second portion on the substrate overlaps the orthographic projection of the corresponding fourth portion on the substrate, so that a larger overlapping area can be formed between the second auxiliary signal line pattern 802 and the corresponding initialization signal line pattern 904, which is more conducive to improve the stability of the initialization signal transmitted on the initialization signal line pattern 904.

As shown in FIG. 7 and FIG. 11, in some embodiments, the initialization signal line pattern 904 includes a first sub-pattern 9041 and a second sub-pattern 9042, and the first sub-pattern 9041 includes the third portion, the second sub-pattern 9042 includes the third portion and the fourth portion; in the adjacent sub-pixel areas in the same row along the first direction, the orthographic projection of the first portion 8021 of the second auxiliary signal line pattern 802 corresponding to the previous sub-pixel area on the substrate overlaps the orthographic projection of the third portion of the second sub-pattern 9042 in the previous sub-pixel area on the substrate, and also overlaps the orthographic projections of the third portion of the first sub-pattern 9041 in the current sub-pixel on the substrate.

Specifically, the initialization signal line pattern 904 located in the same sub-pixel area may specifically include a first sub-pattern 9041 and a second sub-pattern 9042 that are independent of each other. Exemplarily, the first sub-pattern 9041 includes a third portion extending in the first direction, the second sub-pattern 9042 includes a third portion extending in the first direction and a fourth portion extending in the fourth direction. Exemplarily, the third portion and the fourth portion included in the second sub-pattern 9042 may be specifically formed as a cross-shaped structure or a T-shaped structure.

In adjacent sub-pixel areas located in the same row along the first direction, the third portion of the second sub-pattern 9042 in the previous sub-pixel area and the third portion of the first sub-pattern 9041 in the current sub-pixel area are arranged on one straight line extending along the first direction.

In the adjacent sub-pixel areas in the same row along the first direction, the orthographic projection of the first portion 8021 of the second auxiliary signal line pattern 802 corresponding to the previous sub-pixel area on the substrate overlaps the orthographic projection of the third portion of the second sub-pattern 9042 in the previous sub-pixel area on the substrate, and also overlaps the orthographic projection of the third portion of the first sub-pattern 9041 in the current sub-pixel area on the substrate; so that the second auxiliary signal line pattern 802 can form a capacitance structure with the initialization signal line pattern 904 in each adjacent sub-pixel area at the same time, so that a larger overlapping may be formed between the second auxiliary signal line pattern 802 and the initialization signal line patterns 904, which is more conducive to improve the stability of the initialization signal transmitted on the initialization signal line pattern 904.

As shown in FIG. 5 and FIG. 11, in some embodiments, the third overlapping are is formed between the orthographic projection of the second portion 8022 on the substrate and the orthographic projection of the power signal line pattern 901 on the substrate, the second portion is coupled to the power signal line pattern 901 through the third via hole 63 arranged in the third overlapping area, and the orthographic projection of the third via hole 63 on the substrate does not overlap the orthographic projection of the initialization signal line pattern 904 on the substrate.

Specifically, the specific coupling methods between the power signal line pattern 901 and the corresponding second auxiliary signal line pattern 802 are various. Exemplarily, the third overlapping area is formed between the orthographic projection of the power signal line pattern 901 on the substrate and the orthographic projection of the second portion in the corresponding second auxiliary pattern on the substrate, and the third via hole 63 is formed in the third overlapping area, and the power signal line pattern 901 is coupled to the second portion 8022 in the corresponding second auxiliary signal line pattern 802 through the third via hole 63.

Since the third overlapping area has a large area, the layout space of the third via hole 63 is large. Exemplarily, the orthographic projection of the third via hole 63 on the substrate does not overlap the orthographic projection of the initialization signal line pattern 904 on the substrate; even if process fluctuations occurs during the process of forming the third via hole 63, it is possible to prevent the third via hole 63 from extending to the initialization signal line pattern 904, resulting in a short circuit between the second auxiliary signal line pattern 802 and the initialization signal line pattern 904.

As shown in FIG. 3 and FIG. 11, in some embodiments, the display panel further includes: a third auxiliary signal line layer located between the initialization signal line layer and the power supply signal line layer, the third auxiliary signal line layer includes a third auxiliary signal line pattern 803 located in each of the sub-pixel areas, and at least a portion of the third auxiliary signal line pattern 803 extends along the first direction; in the same sub-pixel area, a fourth overlapping area is formed between the orthographic projection of the third auxiliary signal line pattern 803 on the substrate and the orthographic projection of the power signal line pattern 901 on the substrate, and the third auxiliary signal line pattern 803 is coupled to the power signal line patterns 901 in the fourth overlapping area; the third auxiliary signal line patterns 803 in the same row of sub-pixel areas along the first direction are coupled in sequence.

Specifically, the third auxiliary signal line patterns 803 correspond to the sub-pixel areas in a one-to-one manner, the third auxiliary signal line pattern 803 is located in the corresponding sub-pixel area, and at least the third auxiliary signal line pattern 803 extends along the first direction, and the third auxiliary signal line patterns 803 in the same row of sub-pixel areas along the first direction are formed in an integral structure.

At least a portion of the power signal line pattern 901 extends along a second direction, and the second direction intersects with the first direction, so in the same sub-pixel area, the fourth overlapping area is formed between the orthographic projection of the third auxiliary signal line pattern 803 on the substrate and the orthographic projection of the power signal line pattern 901 on the substrate, and the third auxiliary signal line pattern 803 is coupled to the power signal line pattern 901 through the third via hole in the fourth overlapping area.

In the display panel provided by the above embodiment, the power signal line patterns 901 in the same column of sub-pixel areas along the second direction are sequentially coupled, and the third auxiliary signal line patterns 803 in the same row of sub-pixel areas along the first direction are sequentially coupled, and the third auxiliary signal line pattern 803 is coupled to the power supply signal line pattern 901 in the same sub-pixel, so that the power supply signal line layer and the third auxiliary signal line layer form a grid structure of crossing wiring. This arrangement effectively improves the stability of the power signal line layer, and the power signal transmitted on the power signal line layer is applied to the source electrode of the driving transistor in the sub-pixel driving circuit, while the light emitting current generated by the sub-pixel driving circuit is $I_{oled}=k[(Vgs-Vth)]^2$, Vgs=Vg−Vs, Vg is the gate voltage of the driving transistor, Vs is the source voltage of the driving transistor, and Vth is the threshold voltage of the driving transistor, so the power signal of Vs will have an impact on the size of the light emitting current bled. Therefore, the above setting method can improve the stability of the power signal line layer, ensure the stability of light emitting current $I_{oled}$, and effectively avoid dynamic crosstalk phenomenon.

Figure 10:
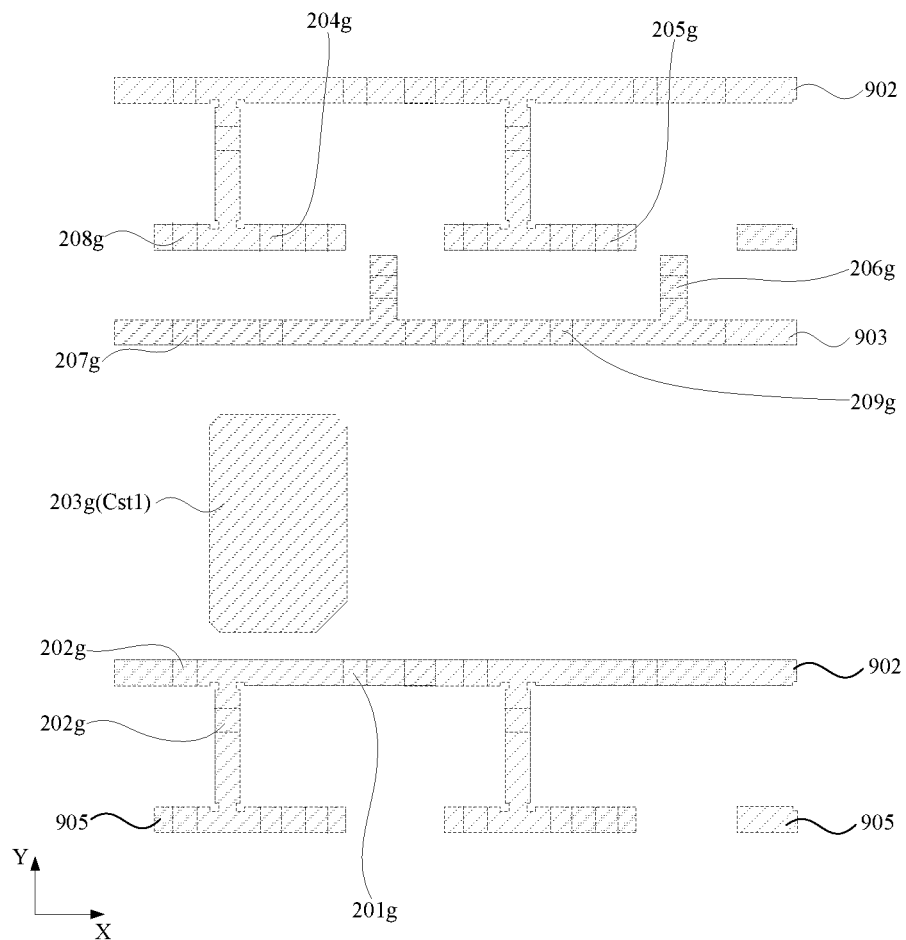
FIG. 10 is a schematic diagram of a layout of a first gate metal layer in FIG. 3.

As shown in FIG. 9 to FIG. 11, in some embodiments, the display panel further includes a transistor structure and a storage capacitor Cst, and the storage capacitor Cst includes a first electrode plate Cst1 and a second electrode plate Cst2 disposed opposite to each other, so that the first electrode plate Cst1 is located between the substrate and the second electrode plate Cst2, and the first electrode plate Cst1 and the gate electrode of the transistor structure are arranged at the same layer and made of the same material; the second auxiliary signal line layer and the third auxiliary signal line layer are arranged at the same layer and made of the same material as the second electrode plate Cst2.

Specifically, the layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer stacked in sequence along the direction away from the substrate.

The sub-pixel driving circuit includes a storage capacitor and a plurality of transistor structures, the active film layer is used to form active patterns in the plurality of transistor structures, and the first gate metal layer is used to form the gate electrodes of the plurality of transistor structures and the first electrode plate of the storage capacitor, the second gate metal layer is used to form the second electrode plate of the storage capacitor, and the first source-drain metal layer is used to form the source electrode and the drain electrode of the transistor structure.

The first electrode plate and the gate electrode of the transistor structure are arranged at the same layer and made of the same material, so that the first electrode plate and the gate electrode of the transistor structure can be formed simultaneously in the same patterning process, thereby simplifying the production process of the display panel, and saving the production cost. Similarly, the second auxiliary signal line layer and the third auxiliary signal line layer are arranged at the same layer and made of the same material as the second electrode plate, so that the second auxiliary signal line layer, the third auxiliary signal line layer and the second electrode plate are simultaneously formed in the same patterning process, thereby better simplifying the manufacturing process of the display panel and saving the production cost.

It should be noted that the above "the same layer" refers to a layer structure formed by using the same film forming process to form a film layer of a specific pattern, and then using the same mask to form the layer structure through a single patterning process. Depending on the specific pattern, a patterning process may include multiple exposure, development or etching processes, and the specific patterns in the formed layer structure may be continuous or discontinuous, and these specific patterns may also be at different heights or have different thicknesses.

As shown in FIG. 4 and FIG. 10, in some embodiments, the display panel further includes: a gate line pattern 902 and a reset signal line pattern 905 located in each of the sub-pixel areas, and the gate line pattern 902 in the current sub-pixel area and the reset signal line pattern 905 in the next sub-pixel area adjacent in the second direction forms an integral structure.

Specifically, at least part of each of the gate line patterns 902 extends along the first direction, and the gate line patterns 902 located in the sub-pixel areas in the same row along the first direction are electrically connected in sequence to form an integral structure; each of the reset signal line patterns 905 extends along the first direction, the gate line pattern 902 in the current sub-pixel area and the reset signal line pattern 905 in the next sub-pixel area adjacent along the second direction form an integral structure through the connecting portion extending along the second direction.

The gate line pattern 902, the reset signal line pattern 905, and the light emitting control signal line pattern 903 included in the display panel can all be made of the first gate metal layer, so that the gate line pattern 902, the reset signal line pattern 905 and the light emitting control signal line pattern 903 can be formed in the same patterning process, thereby effectively simplifying the manufacturing process and saving the production cost.

The gate line pattern 902 in the current sub-pixel area and the reset signal line pattern 905 in the next sub-pixel area adjacent along the second direction form an integral structure, so that the scan signal transmitted on the gate line pattern 902 in the sub-pixel area in the previous row can be used as the reset signal transmitted on the reset signal line pattern 905 in the sub-pixels in the current row, so as to avoid introducing a special signal transmission path for providing the reset signal for the reset signal line pattern 905, effectively reduce the layout space occupied by the reset signal line pattern 905, which is more conducive to improve the resolution of the display panel. The above layout can support a display panel with a pixel resolution of 400 PPI.

As shown in FIG. 7 and FIG. 8, in some embodiments, the display panel further includes a transistor structure, and the initialization signal line pattern 904 and the active layer in the transistor structure are arranged at the same layer and made of the same material.

Specifically, the above-mentioned setting of the initialization signal line pattern 904 and the active layer in the transistor structure being arranged at the same layer and made of the same material enables the initialization signal line pattern 904 and the active layer to be made in the same patterning process. Moreover, since the first electrode (or the second electrode) of the transistor structure in the display panel coupled to the initialization signal line pattern 904 is also made of the active layer, the first electrode (or the second electrode) and the initialization signal line pattern 904 coupled to the first electrode (or the second electrode) can be formed into an integral structure, thereby further saving the layout space occupied by the transistor structure and the initialization signal line pattern 904, improving the resolution of the display panel.

As shown in FIG. 5, in some embodiments, the first auxiliary signal line layer 801 and the anode layer are arranged at the same layer and made of the same material.

Specifically, the first auxiliary signal line layer 801 and the anode layer are arranged at the same layer and made of the same material, so that the first auxiliary signal line layer 801 and the anode layer can be formed in the same patterning process, and an additional patterning process specially used for manufacturing the first auxiliary cathode layer is not necessary, thereby effectively simplifying the manufacturing process and saving the production cost.

It is worth noting that when the first auxiliary signal line layer 801 and the anode layer are arranged at the same layer and made of the same material, a certain distance needs to be reserved between the first auxiliary signal line layer 801 and the anode layer, so as to avoid the short circuit between the first auxiliary signal line layer 801 and the anode layer, and avoid affecting the yield of the display panel.

As shown in FIG. 1, FIG. 3, FIG. 4 and FIG. 9, in some embodiments, the display panel further includes: a power signal line pattern 901, a data line pattern 908, a reset signal line pattern 905, a light emitting control signal line pattern 903 and a gate line pattern 902 located in each of the sub-pixel areas; further includes sub-pixel driving circuits corresponding to the sub-pixel areas in a one-to-one manner, each of the sub-pixel driving circuits includes: a first transistor T1, a second transistor T2, a third transistor T3, a fourth transistor T4, a fifth transistor T5, a sixth transistor T6, a seventh transistor T7, an eighth transistor T8 and a storage capacitor Cst;

The gate electrode 201g of the first transistor T1 is coupled to the gate line pattern 902, the first electrode S1 of the first transistor T1 is coupled to the data line pattern 908, and the second electrode D1 of the first transistor T1 is coupled to the second electrode plate Cst2 of the storage capacitor Cst, and the first electrode plate Cst1 of the storage capacitor Cst is coupled to the gate electrode 203g of the third transistor T3;

The gate electrode 202g of the second transistor T2 is coupled to the gate line pattern 902, the first electrode S2 of the second transistor T2 is coupled to the second electrode D3 of the third transistor T3, the second electrode D2 of the second transistor T2 is coupled to the gate electrode 203g of the third transistor T3;

The first electrode S3 of the third transistor T3 is coupled to the power signal line pattern 901;

The gate electrode 204g of the fourth transistor T4 is coupled to the reset signal line pattern 905, the first electrode S4 of the fourth transistor T4 is coupled to the initialization signal line pattern 904, and the second electrode D4 of the fourth transistor T4 is coupled to the gate electrode 203g of the third transistor T3;

The gate electrode 205g of the fifth transistor T5 is coupled to the reset signal line pattern 905, the first electrode S5 of the fifth transistor T5 is coupled to the initialization signal line pattern 904, and the second electrode D5 of the fifth transistor T5 is coupled to the second electrode plate Cst2 of the storage capacitor Cst;

The gate electrode 206g of the sixth transistor T6 is coupled to the light emitting control signal line pattern 903, the first electrode S6 of the sixth transistor T6 is coupled to the initialization signal line pattern 904, and the second electrode D6 of the sixth transistor T6 is coupled to the second electrode plate Cst2 of the storage capacitor Cst;

The gate electrode 207g of the seventh transistor T7 is coupled to the light emitting control signal line pattern 903, the first electrode S7 of the seventh transistor T7 is coupled to the second electrode D3 of the third transistor T3, and the second electrode D7 of the seventh transistor T7 is coupled to the anode pattern 906 of the corresponding light emitting element EL, and the cathode of the light emitting element EL is coupled to the negative power signal line VSS;

The gate electrode 208g of the eighth transistor T8 is coupled to the reset signal line pattern 905, the first electrode S8 of the eighth transistor T8 is coupled to the initialization signal line pattern 904, and the second electrode D8 of the eighth transistor T8 is coupled to the anode pattern 906 of the corresponding light emitting element EL.

Specifically, at least part of the power signal line pattern 901 and the data line pattern 908 extend along the second direction; at least part of the gate line pattern 902, the light emitting control signal line pattern 903, the reset signal line pattern 905 all extend along a first direction, the first direction intersects the second direction. Exemplarily, the first direction includes the X direction, and the second direction includes the Y direction.

The plurality of sub-pixel areas can be divided into a plurality of rows of sub-pixel areas arranged in sequence along the second direction, and a plurality of columns of sub-pixel areas arranged in sequence along the first direction, and gate line patterns 902 in the sub-pixel areas in the same row are electrically connected in sequence to form an integral structure; the light emitting control signal line patterns 903 in sub-pixel areas in the same row are sequentially electrically connected to form an integral structure; the data line patterns located in sub-pixel areas 908 in the same column are electrically connected in sequence to form an integral structure; the power signal line patterns 901 located in sub-pixel areas the same column are electrically connected in sequence to form an integral structure.

The layout of film layers in the display panel is as follows: a buffer layer, a sub-pixel driving circuit film layer, an anode layer, a pixel defining layer and a spacer layer that are sequentially stacked on the substrate along the direction away from the substrate. The layout of film layers corresponding to the sub-pixel driving circuit is as follows: an active film layer, a first gate insulating layer, a first gate metal layer, a second gate insulating layer, a second gate metal layer, an interlayer insulating layer, a first source-drain metal layer and a planarization layer that are sequentially stacked along the direction away from the substrate.

As shown in FIG. 8, the active film layer is used to form the channel area (e.g. 101g-109g), the first electrode (e.g. S1-S9) and the second electrode (e.g. D1-D9) of each transistor in the sub-pixel driving circuit, due to the doping effect, the conductivity of the active film layer corresponding to the first electrode and the second electrode will be better than that of the active film layer corresponding to the channel area; the active film layer can be made of amorphous silicon, polysilicon, oxide semiconductor materials, etc. It should be noted that, the first electrode and the second electrode may be doped with n-type impurities or p-type impurities. In addition, it should be noted that the active film layer corresponding to the first electrode and the second electrode can be directly used as the source electrode or drain electrode of the corresponding transistor, or the source electrode in contact with the first electrode may be made of a metal material, the drain electrode in contact with the second electrode is made of a metal material.

The active film layer is also used to form the initialization signal line pattern 904, and the portion of the active film layer used to form the initialization signal line pattern 904 can have good electrical conductivity due to doping.

The first gate metal layer is used to form the gate electrodes of the transistors in the sub-pixel drive circuit (e.g. 201g-209g), as well as the gate line pattern 902, the light emission control signal line pattern 903, the reset signal line pattern 905 and other structures included in the display panel, the gate electrode 203g of the third transistor T3 in each sub-pixel driving circuit is multiplexed as the first electrode plate Cst1 of the storage capacitor Cst in the sub-pixel driving circuit.

The second gate metal layer is used to form the second electrode plate Cst2 of the storage capacitor Cst, and the second auxiliary signal line layer and the third auxiliary signal line layer included in the display panel.

The first source-drain metal layer is used to form data line patterns 908, power signal line patterns 901 and some conductive connection portions.

Figure 1:
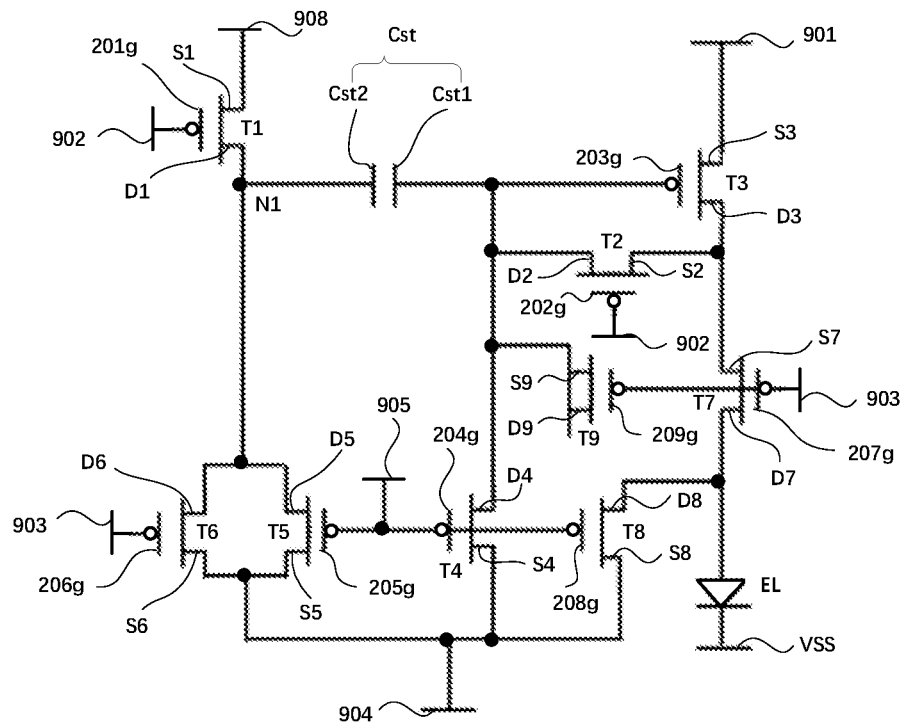
FIG. 1 is a circuit diagram of a sub-pixel driving circuit provided by an embodiment of the present disclosure.
Figure 2:
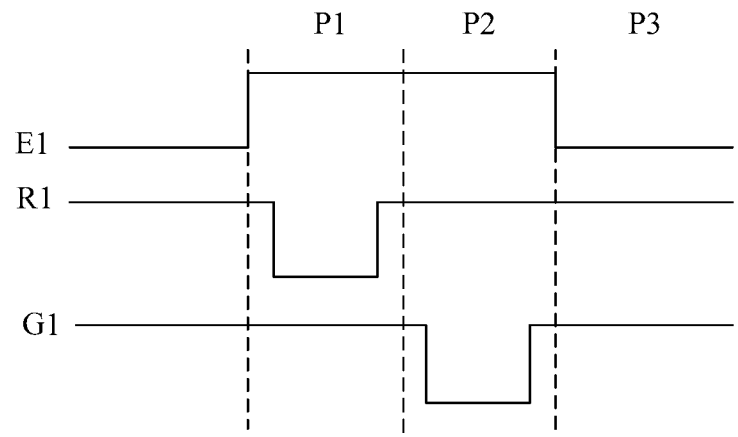
FIG. 2 is a working timing diagram of a sub-pixel driving circuit provided by an embodiment of the present disclosure.

As shown in FIG. 1 and FIG. 2, when the sub-pixel driving circuit with the above structure is in operation, each working cycle includes a reset period P1, a writing-in compensation period P2 and a light emitting period P3. In FIG. 2, E1 represents the light emitting control signal transmitted on the light emitting control signal line pattern 903 in the current sub-pixel area, R1 represents the reset signal transmitted on the reset signal line pattern 905 in the current sub-pixel area, and G1 represents the gate scan signal transmitted on the gate line pattern 902 in the current sub-pixel area.

During the reset period P1, the reset signal inputted by the reset signal line pattern 905 is at a valid level, the fourth transistor T4, the fifth transistor T5 and the eighth transistor T8 are turned on, and the initialization signal transmitted by the initialization signal line pattern 904 is inputted into the gate electrode 203g of the third transistor T3, the anode pattern 906 and the second electrode plate of the storage capacitor, so that the gate-source voltage Vgs maintained on the third transistor T3 in the previous frame is cleared, and the gate electrode 203g of the third transistor T3 is reset, and the anode pattern 906 and the second electrode plate of the storage capacitor are reset at the same time.

During the writing-in compensation period P2, the reset signal inputted by the reset signal line pattern 905 is at an invalid level, the fourth transistor T4, the fifth transistor T5 and the eighth transistor T8 are all turned off, and the scan signal inputted by the gate line pattern 902 is at a valid level, so that the first transistor T1 and the second transistor T2 are turned on, the data line pattern 908 writes the data signal, and transmits the data signal to the N1 node through the first transistor T1, and the data line pattern 908 is coupled to the gate electrode of the third transistor T3 through the storage capacitor. At the same time, the first transistor T1 and the second transistor T2 are turned on, so that the third transistor T3 is formed into a diode structure. Therefore, the first transistor T1, the third transistor T3 and the second transistor T2 work together to achieve the voltage compensation to the threshold voltage of the third transistor T3. When the compensation time is long enough, the potential of the gate electrode 203g of the third transistor T3 can be controlled to finally reach Vth+VDD, where VDD is the power signal voltage value, and Vth represents the threshold voltage of the third transistor T3.

In the light emitting period P3, the light emitting control signal written by the light emitting control signal line pattern 903 is at a valid level, the sixth transistor T6 and the seventh transistor T7 are controlled to be turned on, and the power supply signal transmitted by the power supply signal line pattern 901 is inputted to the source electrode of the third transistor T3. At the same time, due to the coupling effect of the storage capacitor, the voltage of the gate electrode 203g of the third transistor T3 becomes Vint−Vdata+Vth+VDD, where Vdata represents the data signal voltage value, and Vint represents the initial signal voltage value, so that the third transistor T3 is turned on, the gate-source voltage corresponding to the third transistor T3 is Vdata−Vint+Vth, and the leakage current generated based on the gate-source voltage flows to the anode pattern 906 of the corresponding light emitting element EL to drive the corresponding light emitting element EL to emit light.

In some embodiments, the sub-pixel driving circuit further includes a ninth transistor T9, the gate electrode 209g of the ninth transistor T9 is coupled to the light emitting control signal line pattern 903, the first electrode S9 of the ninth transistor T9 is coupled to the gate electrode 203g of the third transistor T3, and the second electrode D9 of the ninth transistor T9 is floating.

Specifically, in the reset period P1 and the writing-in compensation period P2, the light emitting control signal written by the light emitting control signal line pattern 903 is at an invalid level, and the ninth transistor T9 is controlled to be turned off. In the light emitting period P3, the light emitting control signal written by the light emitting control signal line pattern 903 is at a valid level, and the ninth transistor T9 is controlled to be turned on.

The sub-pixel driving circuit also includes the ninth transistor T9, so that during the light emitting period, the ninth transistor T9 is turned on, so that the excess charge accumulated by the gate electrode 203g of the third transistor T3 can be released to ensure the stability of the potential of the gate electrode 203g of the transistor T3.

It should be noted that when entering the light emitting period P3 from the writing-in compensation period P2, the potential of the scan signal inputted by the gate line pattern 902 increases, thereby pulling the potential of the gate electrode 203g of the third transistor T3, so that excess charge are accumulated at the gate electrode 203g of the third transistor T3.

Embodiments of the present disclosure further provide a display device, including the display panel provided by the above embodiments.

Since the display panel provided by the above embodiment includes the initialization signal line pattern 904 in each sub-pixel area and the first auxiliary signal line layer 801 of the grid structure in the anode spacing area 9061, the initialization signal line pattern 904 in each of the sub-pixel areas is coupled to the first auxiliary signal line layer 801, so that the first auxiliary signal line layer 801 couples all the initialization signal line patterns 904 in the sub-pixel areas together. It is realized that the first auxiliary signal line layer 801 can provide an initialization signal for the initialization signal line pattern 904 in each of the sub-pixel areas; therefore, in the display panel provided by the embodiment of the present disclosure, the initialization signal line pattern 904 in each sub-pixel area is coupled to the first auxiliary signal line layer 801 arranged in the anode spacing area 9061, which solves the problem that the initialization signal line patterns 904 in the same row are not easily connected together due to the limited layout space of the display panel. Moreover, in the display panel provided by the above-mentioned embodiment, the first auxiliary signal line layer 801 can be laid out in all the anode spacing areas 9061 in the display area, and the initialization signal line pattern 904 in each sub-pixel area can be coupled to the first auxiliary signal line layer 801, thereby ensuring the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged in the same layer, which is more conductive to the thinning of the display panel.

Therefore, when the display device provided by the embodiment of the present disclosure includes the above-mentioned display panel, it also has the above-mentioned beneficial effects, which will not be repeated here.

It should be noted that the display device may be any product or component with a display function, such as a TV, a monitor, a digital photo frame, a mobile phone, a tablet computer, and the like.

An embodiment of the present disclosure further provides a method of manufacturing a display panel, which is used to manufacture the display panel provided in the above-mentioned embodiments, where the display panel includes a plurality of sub-pixel areas arranged in an array; the manufacturing method includes:

forming an initialization signal line layer on a substrate, the initialization signal line layer including an initialization signal line pattern 904 arranged in each of the sub-pixel areas;

forming a first auxiliary signal line layer 801 and an anode layer on a side of the initialization signal line pattern 904 away from the substrate; the anode layer includes a plurality of anode patterns 906 corresponding to the plurality of sub-pixel areas in a one-to-one manner, the plurality of anode patterns 906 are arranged at intervals, and anode spacing areas 9061 are formed between adjacent anode patterns 906; the first auxiliary signal line layer 801 is a grid structure, and at least part of the first auxiliary signal line layer 801 is located in the anode spacing area 9061 and insulated from the anode pattern 906, and the initialization signal line pattern 904 in each of the sub-pixel areas is coupled to the first auxiliary signal line layer 801.

The display panel manufactured by the method provided by the embodiment of the present disclosure includes an initialization signal line pattern 904 in each sub-pixel area, and a first auxiliary signal line layer 801 of a grid structure in the anode spacing area 9061, by setting the initialization signal line pattern 904 in each of the sub-pixel areas to be coupled to the first auxiliary signal line layer 801, so that the first auxiliary signal line layer 801 couples all the initialization signal line patterns in the sub-pixel area 904 together, so as to realize that the first auxiliary signal line layer 801 can provide an initialization signal for the initialization signal line pattern 904 in each sub-pixel area; therefore, the display panel manufactured by the method provided by the embodiment of the present disclosure, the initialization signal line pattern 904 in each sub-pixel area is coupled to the first auxiliary signal line layer 801 arranged in the anode spacing area 9061, which solves the problem that the initialization signal line patterns 904 in the same row are not easily connected together due to the limited layout space of the display panel.

Moreover, for the display panel manufactured by the manufacturing method provided by the embodiment of the present disclosure, the first auxiliary signal line layer 801 can be laid out in all the anode spacing areas 9061 in the display area, and the initialization signal line pattern 904 in each sub-pixel area can be coupled to the first auxiliary signal line layer 801, thereby ensuring the stability of the initialization signal transmitted on the initialization signal line pattern 904 in each sub-pixel area. In addition, by arranging the first auxiliary cathode layer in the anode spacing area 9061, the first auxiliary signal line layer 801 and the anode layer can be arranged at the same layer, which is more beneficial to the thinning of the display panel.

It should be noted that the various embodiments in this specification are described in a progressive manner, and the same or similar parts among the various embodiments can be referred to each other, and each embodiment focuses on the differences from other embodiments. In particular, for the method embodiment, since it is basically similar to the product embodiment, the description is relatively simple, and the relevant portion can be referred to the description of the product embodiment.

Unless otherwise defined, the technical or scientific terms used in the present disclosure shall have the usual meanings understood by those with ordinary skills in the field to which this disclosure belongs. The "first", "second" and similar words used in the present disclosure do not indicate any order, quantity or importance, but are only used to distinguish different components. The word "include" or "comprise" and other similar words mean that the element or item appearing before the word encompasses the element or item listed after the word and its equivalents, but does not exclude other elements or items. Similar words such as "connected" or "coupled" are not limited to physical or mechanical connections, but may include electrical connections, whether direct or indirect. "Up", "Down", "Left", "Right", etc. are only used to indicate the relative position relationship. When the absolute position of the described object changes, the relative position relationship may also change accordingly.

It can be understood that when an element such as a layer, film, area, or substrate is referred to as being "on" or "under" another element, the element can be "directly" on or "under" the other element, or there may be intermediate elements therebetween.

In the description of the foregoing embodiments, specific features, structures, materials, or characteristics may be combined in any one or more embodiments or examples in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising: a substrate, and an initialization signal line layer and an anode layer sequentially stacked on the substrate along a direction away from the substrate, and a plurality of sub-pixel areas arranged in an array; wherein the initialization signal line layer includes an initialization signal line pattern arranged in each of the plurality of sub-pixel areas;

the anode layer includes a plurality of anode patterns corresponding to the plurality of sub-pixel areas in a one-to-one manner, the plurality of anode patterns are arranged at intervals, and an anode spacing area is formed between adjacent anode patterns;

the display panel further includes: a first auxiliary signal line layer, the first auxiliary signal line layer has a grid structure, and at least part of the first auxiliary signal line layer is located in the anode spacing area and is insulated from the anode pattern, and the initialization signal line pattern in each of plurality of the sub-pixel areas is coupled to the first auxiliary signal line layer;

wherein the display panel further comprises:

a power supply signal line layer located between the initialization signal line layer and the anode layer, wherein the power supply signal line layer includes a power signal line pattern arranged in each of the plurality of sub-pixel areas, and at least part of the power signal line pattern extends along a second direction; and a second auxiliary signal line layer located between the initialization signal line layer and the power supply signal line layer, wherein the second auxiliary signal line layer includes second auxiliary signal line patterns corresponding to the plurality of sub-pixel areas in a one-to-one manner, a third overlapping area is formed between orthographic projection of the power signal line pattern on the substrate and orthographic projection of a corresponding second auxiliary signal line pattern on the substrate, the second auxiliary signal line pattern is coupled to the power signal line pattern in the third overlapping area, orthographic projection of the second auxiliary signal line pattern on the substrate overlaps orthographic projection of the corresponding initialization signal line pattern on the substrate;

wherein the second auxiliary signal line pattern includes a first portion extending along the first direction and a second portion extending along the second direction, the first direction intersects the second direction;

the initialization signal line pattern includes a third portion extending along the first direction and a fourth portion extending along the second direction, and orthographic projection of the first portion on the substrate overlaps orthographic projection of the third portion on the substrate, and orthographic projection of the second portion on the substrate overlaps orthographic projection of the fourth portion on the substrate.

2. The display panel according to claim 1, further comprising:
a conductive connection portion layer located between the initialization signal line layer and the first auxiliary signal line layer, wherein the conductive connection portion layer includes a first conductive connection portion arranged in each of plurality of the sub-pixel areas; in a same sub-pixel area, a first overlapping area is formed between orthographic projection of the first conductive connection portion on the substrate and orthographic projection of the initialization signal line pattern on the substrate, a second overlapping area is formed between the orthographic projection of the first conductive connection portion on the substrate and the first auxiliary signal line layer, the first conductive connection portion is coupled to the initialization signal line pattern in the first overlapping area, and the first conductive connection portion is coupled to the first auxiliary signal line layer in the second overlapping area.

3. The display panel according to claim 1, wherein each of the initialization signal line patterns includes a first sub-pattern and a second sub-pattern, and in adjacent sub-pixel areas in a same row along a first direction, a second sub-pattern in a previous sub-pixel area and a first sub-pattern in a current sub-pixel area form an integral structure; the second sub-pattern is coupled to the first auxiliary signal line layer in each of the plurality of sub-pixel areas.

4. The display panel according to claim 1, wherein the initialization signal line pattern includes a first sub-pattern and a second sub-pattern, and the first sub-pattern includes the third portion, the second sub-pattern includes the third portion and the fourth portion;
in adjacent sub-pixel areas in a same row along the first direction, orthographic projection of the first portion of the second auxiliary signal line pattern corresponding to a previous sub-pixel area on the substrate overlaps orthographic projection of the third portion of the second sub-pattern in the previous sub-pixel area on the substrate, and overlaps orthographic projections of the third portion of the first sub-pattern in a current sub-pixel on the substrate.

5. The display panel according to claim 1, wherein the third overlapping area is formed between the orthographic projection of the second portion on the substrate and the orthographic projection of the power signal line pattern on the substrate, the second portion is coupled to the power signal line pattern through a third via hole arranged in the third overlapping area, and orthographic projection of the third via hole on the substrate does not overlap the orthographic projection of the initialization signal line pattern on the substrate.

6. The display panel according to claim 1, further comprising:
a third auxiliary signal line layer located between the initialization signal line layer and the power supply signal line layer, wherein the third auxiliary signal line layer includes a third auxiliary signal line pattern located in each of the plurality of sub-pixel areas, and at least part of the third auxiliary signal line pattern extends along the first direction; in a same sub-pixel area, a fourth overlapping area is formed between orthographic projection of the third auxiliary signal line pattern on the substrate and the orthographic projection of the power signal line pattern on the substrate, and the third auxiliary signal line pattern is coupled to the power signal line patterns in the fourth overlapping area; third auxiliary signal line patterns in a same row of sub-pixel areas along the first direction are coupled in sequence.

7. The display panel according to claim 6, further comprising:
a transistor structure and a storage capacitor, wherein the storage capacitor includes a first electrode plate and a second electrode plate arranged opposite to each other, the first electrode plate is located between the substrate and the second electrode plate, and the first electrode plate and a gate electrode of the transistor structure are arranged at a same layer and made of a same material; the second auxiliary signal line layer and the third auxiliary signal line layer are arranged at a same layer and made of a same material as the second electrode plate.

8. The display panel according to claim 1, further comprising:
a gate line pattern and a reset signal line pattern located in each of the plurality of sub-pixel areas, wherein the gate line pattern in a current sub-pixel area and the reset signal line pattern in a next sub-pixel area adjacent in the second direction form an integral structure.

9. The display panel according to claim 1, further comprising a transistor structure, wherein the initialization signal line pattern and an active layer in the transistor structure are arranged at a same layer and made of a same material.

10. The display panel according to claim 1, wherein the first auxiliary signal line layer and the anode layer are arranged at a same layer and made of a same material.

11. The display panel according to claim 1, further comprising: the power signal line pattern, a data line pattern, a reset signal line pattern, a light emitting control signal line pattern and a gate line pattern located in each of the plurality of sub-pixel areas; and sub-pixel driving circuits corresponding to the plurality of sub-pixel areas in a one-to-one manner,
wherein each of the sub-pixel driving circuits includes: a first transistor, a second transistor, a third transistor, a fourth transistor, a fifth transistor, a sixth transistor, a seventh transistor, an eighth transistor and a storage capacitor;
a gate electrode of the first transistor is coupled to the gate line pattern, a first electrode of the first transistor is coupled to the data line pattern, and a second electrode of the first transistor is coupled to a second electrode plate of the storage capacitor, and a first electrode plate of the storage capacitor is coupled to a gate electrode of the third transistor;

a gate electrode of the second transistor is coupled to the gate line pattern, a first electrode of the second transistor is coupled to a second electrode of the third transistor, a second electrode of the second transistor is coupled to the gate electrode of the third transistor;

a first electrode of the third transistor is coupled to the power signal line pattern;

a gate electrode of the fourth transistor is coupled to the reset signal line pattern, a first electrode of the fourth transistor is coupled to the initialization signal line pattern, and a second electrode of the fourth transistor is coupled to the gate electrode of the third transistor;

a gate electrode of the fifth transistor is coupled to the reset signal line pattern, a first electrode of the fifth transistor is coupled to the initialization signal line pattern, and a second electrode of the fifth transistor is coupled to the second electrode plate of the storage capacitor;

a gate electrode of the sixth transistor is coupled to the light emitting control signal line pattern, a first electrode of the sixth transistor is coupled to the initialization signal line pattern, and a second electrode of the sixth transistor is coupled to the second electrode plate of the storage capacitor;

a gate electrode of the seventh transistor is coupled to the light emitting control signal line pattern, a first electrode of the seventh transistor is coupled to the second electrode of the third transistor, and a second electrode of the seventh transistor is coupled to a corresponding anode pattern;

a gate electrode of the eighth transistor is coupled to the reset signal line pattern, a first electrode of the eighth transistor is coupled to the initialization signal line pattern, and a second electrode of the eighth transistor is coupled to the corresponding anode pattern.

12. The display panel according to claim 11, wherein the sub-pixel driving circuit further comprises a ninth transistor, a gate electrode of the ninth transistor is coupled to the light emitting control signal line pattern, a first electrode of the ninth transistor is coupled to the gate electrode of the third transistor, and a second electrode of the ninth transistor is floating.

13. A display device comprising the display panel according to claim 1.

14. A method of manufacturing a display panel comprising a plurality of sub-pixel areas arranged in an array; comprising:

forming an initialization signal line layer on a substrate, the initialization signal line layer including an initialization signal line pattern arranged in each of the plurality of sub-pixel areas;

forming a first auxiliary signal line layer and an anode layer on a side of the initialization signal line pattern away from the substrate; wherein the anode layer includes a plurality of anode patterns corresponding to the plurality of sub-pixel areas in a one-to-one manner, the plurality of anode patterns are arranged at intervals, and an anode spacing area is formed between adjacent anode patterns; the first auxiliary signal line layer is a grid structure, and at least part of the first auxiliary signal line layer is located in the anode spacing area and insulated from the anode pattern, and the initialization signal line pattern in each of the plurality of sub-pixel areas is coupled to the first auxiliary signal line layer;

wherein the display panel further comprises:

a power supply signal line layer located between the initialization signal line layer and the anode layer, wherein the power supply signal line layer includes a power signal line pattern arranged in each of the plurality of sub-pixel areas, and at least part of the power signal line pattern extends along a second direction; and a second auxiliary signal line layer located between the initialization signal line layer and the power supply signal line layer, wherein the second auxiliary signal line layer includes second auxiliary signal line patterns corresponding to the plurality of sub-pixel areas in a one-to-one manner, a third overlapping area is formed between orthographic projection of the power signal line pattern on the substrate and orthographic projection of a corresponding second auxiliary signal line pattern on the substrate, the second auxiliary signal line pattern is coupled to the power signal line pattern in the third overlapping area, orthographic projection of the second auxiliary signal line pattern on the substrate overlaps orthographic projection of the corresponding initialization signal line pattern on the substrate;

wherein the second auxiliary signal line pattern includes a first portion extending along the first direction and a second portion extending along the second direction, the first direction intersects the second direction;

the initialization signal line pattern includes a third portion extending along the first direction and a fourth portion extending along the second direction, and orthographic projection of the first portion on the substrate overlaps orthographic projection of the third portion on the substrate, and orthographic projection of the second portion on the substrate overlaps orthographic projection of the fourth portion on the substrate.

\* \* \* \* \*